(12) United States Patent
Sonoda et al.

(10) Patent No.: US 7,064,079 B2
(45) Date of Patent: Jun. 20, 2006

(54) METHOD OF REMOVING POLYMER AND APPARATUS FOR DOING THE SAME

(75) Inventors: Hiroyuki Sonoda, Kawasaki (JP);
Hidehiko Kawaguchi, Kawasaki (JP);
Morimitsu Tanaka, Kawasaki (JP);
Hiroki Ohno, Nirasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/615,806

(22) Filed: Jul. 10, 2003

(65) Prior Publication Data

US 2004/0009669 A1 Jan. 15, 2004

(30) Foreign Application Priority Data

Jul. 10, 2002 (JP) .............................. 2002-200849

(51) Int. Cl.
*H01L 21/461* (2006.01)
(52) U.S. Cl. ........................................ 438/720; 438/725
(58) Field of Classification Search ................ 438/720, 438/725, 734, 750
See application file for complete search history.

(56) References Cited

U.S. PATENT DOCUMENTS

| 5,024,722 | A | * | 6/1991 | Cathey, Jr. ................... 438/695 |
|---|---|---|---|---|
| 5,783,101 | A | * | 7/1998 | Ma et al. ..................... 438/720 |
| 6,057,240 | A | * | 5/2000 | Zhou et al. .................. 438/689 |
| 6,162,724 | A | * | 12/2000 | Hsia et al. ................... 438/669 |
| 6,197,733 | B1 | * | 3/2001 | Mikami et al. ............. 510/175 |
| 6,284,908 | B1 | * | 9/2001 | Loy et al. .................... 556/467 |
| 6,303,482 | B1 | * | 10/2001 | Wu et al. ..................... 438/592 |
| 6,358,329 | B1 | * | 3/2002 | Muranaka et al. ............ 134/26 |
| 6,513,537 | B1 | * | 2/2003 | Orii et al. ..................... 134/1.2 |
| 6,764,552 | B1 | * | 7/2004 | Joyce et al. .................... 134/3 |
| 6,831,048 | B1 | * | 12/2004 | Kezuka et al. ............. 510/175 |
| 2002/0111033 | A1 | * | 8/2002 | Wu et al. ..................... 438/745 |
| 2003/0065055 | A1 | * | 4/2003 | Johnston et al. ............. 523/175 |
| 2004/0081924 | A1 | * | 4/2004 | Iwamoto et al. ............. 430/329 |

FOREIGN PATENT DOCUMENTS

| JP | 2000-200744 | 7/2000 |
|---|---|---|
| KR | 10-0208431 | 7/1999 |

* cited by examiner

*Primary Examiner*—Tuan H. Nguyen
(74) *Attorney, Agent, or Firm*—Young & Thompson

(57) ABSTRACT

A method of removing polymer adhered to a sidewall of an etched metal layer formed on a substrate, includes (a) dissolving the polymer by providing chemicals onto a surface of the substrate, and (b) rinsing the chemicals out of the substrate by providing pure water onto a surface of the substrate, wherein at least a part of the step (a) is carried out in oxidation atmosphere.

27 Claims, 6 Drawing Sheets

METHOD OF REMOVING POLYMER AND APPARATUS FOR DOING THE SAME

STATEMENT REGARDING JOINT RESEARCH AGREEMENT

The present application was made on behalf of a joint research agreement between Tokyo Electron Limited and NEC Corporation.

BACKGROUND OF THE INVENTION

1. Field of the Invention

The invention relates to a method of removing polymer in a fabrication process of a semiconductor device, for instance, and further to an apparatus for doing the same.

2. Description of the Related Art

A process of fabricating a semiconductor device, for instance, generally includes a step of forming a metal wire layer at a surface of a semiconductor wafer.

Specifically, a metal wire layer is formed as follows.

First, a metal layer and a barrier layer are formed in this order on a semiconductor wafer. Then, a resist is coated onto the semiconductor wafer, and then, patterned. Then, the metal layer and the barrier layer are dry-etched with the patterned resist being used as a mask. By forming a polymer layer on a sidewall of etched portions in the metal layer while the metal layer is being dry-etched, it is possible to dry-etch the metal layer highly anisotropically and just in accordance with the resist pattern. Then, the resist is removed by dry ashing. Then, the resist residual on the metal layer and polymer layer adhered to a sidewall of the etched metal layer are dissolved by chemicals. Then, the chemicals is rinsed out.

However, the above-mentioned process of removing the polymer layer is accompanied with the problem that, supposing that the metal layer is composed of aluminum (Al), when the chemicals is rinsed out with pure water, the chemicals and pure water react with each other, and resultingly, there is generated solution which corrodes aluminum. For instance, aluminum is most likely to be dissolved in solution containing ammonium fluoride ($NH_4F$) at about 30%.

Even if the chemicals is diluted, since aluminum is readily corroded, aluminum might be dissolved into pure water. In addition, if aluminum contains copper therein, aluminum might be dissolved together with copper as a core due to the cell effect in rinsing the chemicals off with pure water. Furthermore, aluminum thus having been dissolved might be adhered to a semiconductor wafer as contaminants such as metal impurity.

If aluminum of which the metal layer is composed were dissolved, the metal layer would become thin, or would be adhered to a semiconductor wafer as contaminants, resulting in reduction in a yield of fabrication of a semiconductor device.

SUMMARY OF THE INVENTION

In view of the above-mentioned problems in the conventional process of removing a polymer layer, it is an object of the present invention to provide a method of removing a polymer layer which method prevents a metal layer from becoming thin and adhering to a semiconductor wafer as contaminants.

It is also an object of the present invention to provide an apparatus for removing a polymer layer which apparatus does the same.

In one aspect of the present invention, there is provided a method of removing polymer adhered to a sidewall of an etched metal layer formed on a substrate, including (a) dissolving the polymer by providing chemicals onto a surface of the substrate, and (b) rinsing the chemicals out of the substrate by providing pure water onto a surface of the substrate, wherein at least a part of the step (a) is carried out in oxidation atmosphere.

In accordance with the method, oxygen in the oxidation atmosphere makes contact with a sidewall of an etched metal layer. As a result, there is formed an oxide skin at a surface of the sidewall. For instance, if the metal layer is composed of aluminum, aluminum oxide ($Al_2O_3$) is formed at a surface of the sidewall, and resultingly, aluminum is not likely to be dissolved even into a solution containing ammonium fluoride ($NH_4F$) at about 30%. Since the chemicals are rinsed off with the oxide skin being formed at a surface of the sidewall of the etched aluminum layer, aluminum is not dissolved, even if the chemicals are rinsed off with pure water. Accordingly, it is possible to prevent the aluminum layer from becoming thin, and further from adhering to a semiconductor wafer as contaminants, ensuring prevention of reduction in a fabrication yield of a semiconductor device.

The steps (a) and (b) may be carried out in oxidation atmosphere.

The step (a) may be carried out in oxidation atmosphere from the beginning or middle thereof till the step (b) starts.

The oxidation atmosphere may be established after the polymer is dissolved by the chemicals until the sidewall appears. This ensures that oxygen makes contact with a surface of a sidewall of an etched metal layer.

The method may further include the step of (c) rotating the substrate to splash the chemicals out of the substrate by virtue of centrifugal force. The step (c) is carried out between the steps (a) and (b). By rotating the substrate, the chemicals can be splashed out. Hence, when the residual chemicals is rinsed off with pure water, there is not generated a solution of the chemicals and pure water.

There is further provided a method of removing polymer adhered to a sidewall of an etched metal layer formed on a substrate, including (a) dissolving the polymer by providing chemicals onto a surface of the substrate, (b) rotating the substrate to splash the chemicals out of the substrate by virtue of centrifugal force, and (c) rinsing the chemicals out of the substrate by providing pure water onto a surface of the substrate, wherein at least a part of the step (a) is carried out in oxidation atmosphere when a period of time in which the step (a) is carried out is longer than a period of time in which the step (b) is carried out.

The suggested method makes it possible to form an oxide skin having a sufficient thickness without extension of a period of time in which the step (b) is carried out. In addition, it would be possible to prevent particles from adhering to the substrate due to the substrate being excessively dried by the step (b). Furthermore, it would be possible to prevent generation of dusts in a motor which rotates the substrate.

It is preferable that the step (b) is carried out in oxidation atmosphere, which ensures that oxygen makes contact with a sidewall of an etched metal layer for forming an oxide skin having a sufficient thickness.

The method may further include the step (d) of drying the substrate. The step (d) is carried out after the step (b).

It is preferable that the step (a) is carried out in inert atmosphere except while the step (a) is carried out in oxidation atmosphere.

It is preferable that the steps (a) and (c) are repeatedly carried out for dissolving the polymer. This ensures that highly reactive chemicals makes contact with the polymer layer to thereby efficiently remove the polymer layer. In addition, since a surface of the sidewall of the etched metal layer is exposed each time the chemicals is removed, oxygen repeatedly makes contact with a surface of the sidewall, ensuring formation of an oxide skin having a sufficient thickness, at a surface of the sidewall.

In the step (c), the substrate may be washed with pure water.

For instance, the metal layer is an aluminum layer, which may contain copper therein. Since an oxide skin is formed at a surface of the sidewall of the etched metal layer, aluminum is not dissolved into pure water together with copper during the chemicals is rinsed off with pure water.

A barrier layer may be formed on the metal layer. Ammonium fluoride may be used as chemicals.

In another aspect of the present invention, there is provided an apparatus for removing polymer adhered to a sidewall of an etched metal layer formed on a substrate, including (a) a substrate holder which holds at least one substrate, (b) an external chamber movable relative to the substrate holder between a first position in which the external chamber defines a first closed space around the substrate holder and a second position in which the external chamber is kept away from the substrate holder for exposing the substrate holder to atmosphere, (c) an internal chamber located internal of the external chamber and movable relative to both of the substrate holder and the external chamber between a first position in which the internal chamber defines a second closed space around the substrate holder and a second position in which the internal chamber is kept away from the substrate holder for exposing the substrate holder to atmosphere, (d) a chemicals source containing chemicals which dissolves the polymer, (e) a pure water source containing pure water therein, (f) an oxygen-containing gas source containing oxygen-containing gas therein, and (g) a controller which controls movement of the external and internal chambers and flow of the chemicals and the pure water, wherein the controller first keeps the internal chamber in its first position and allows the oxygen-containing gas to flow into the internal chamber for dissolving the polymer in oxidation atmosphere by providing the chemicals onto a surface of the substrate, and then, moves the internal chamber to its second position, and keeps the external chamber in its first position for rinsing the chemicals out of the substrate by providing the pure water onto a surface of the substrate.

It is preferable that the controller allows the oxygen-containing gas to flow into the external chamber while the chemicals is rinsed out.

It is preferable that the controller allows the oxygen-containing gas to flow into the internal chamber at the beginning or in the middle of dissolution of the polymer.

It is preferable that the oxidation atmosphere is established after the polymer is dissolved by the chemicals until the sidewall appears.

The substrate holder may be designed to be rotatable around an axis thereof for splashing the chemicals out of the substrate by virtue of centrifugal force, in which case, it is preferable that the controller allows the oxygen-containing gas to flow into the internal chamber while the substrate holder is rotating.

The apparatus may further include an inert gas source containing inert gas therein, and wherein the controller allows the inert gas to flow into the external and internal chambers except while the oxygen-containing gas exists in the external and internal chambers.

It is preferable that the controller repeatedly carries out dissolving the polymer in oxidation atmosphere by providing the chemicals onto a surface of the substrate, and rinsing the chemicals out of the substrate by providing the pure water onto a surface of the substrate.

The advantages obtained by the aforementioned present invention will be described hereinbelow.

In accordance with the present invention, an oxide skin is formed at a surface of a sidewall of an etched metal layer. Hence, metal is not dissolved into pure water used for rinsing chemicals off. In addition, such an oxide skin enhances a resistance of a surface of a substrate to a mixture solution of chemicals and pure water. Furthermore, the present invention prevents generation of contaminants in the step of rinsing the chemicals off. Accordingly, the present invention prevents a metal layer from becoming thin, and further prevents dissolved metal from adhering to a substrate as contaminants.

In addition, an oxide skin can be formed without extension in a period of time in which a substrate is rotated for splashing out chemicals. This ensures no reduction in a throughput, and prevents adhesion of particles to a substrate and generation of dusts out of a motor which rotates a substrate.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 1:
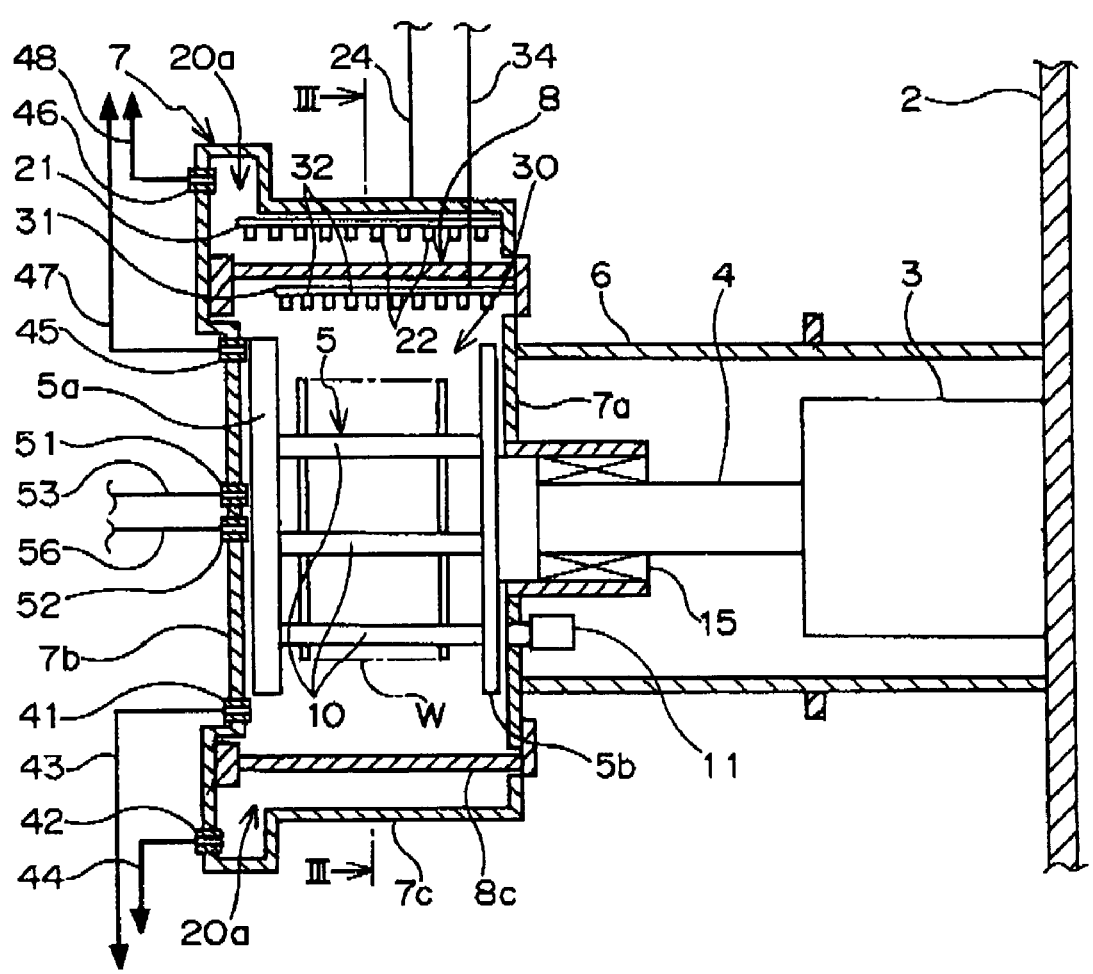
FIG. 1 is a cross-sectional view of an apparatus for removing polymer in fabrication of a semiconductor device, in accordance with a preferred embodiment of the present invention.
Figure 2:
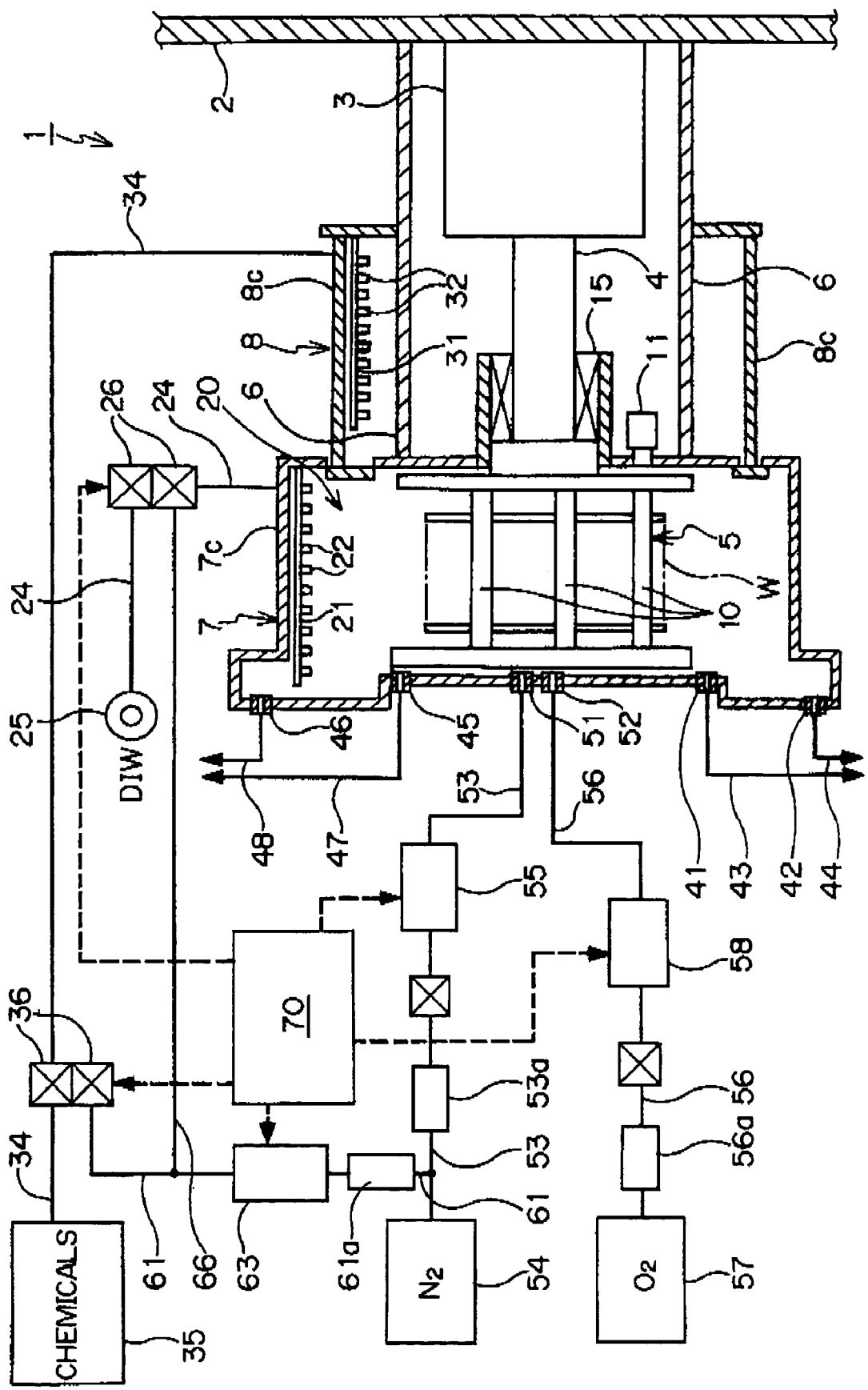
FIG. 2 is another cross-sectional view of the apparatus illustrated in FIG. 1.
Figure 3:
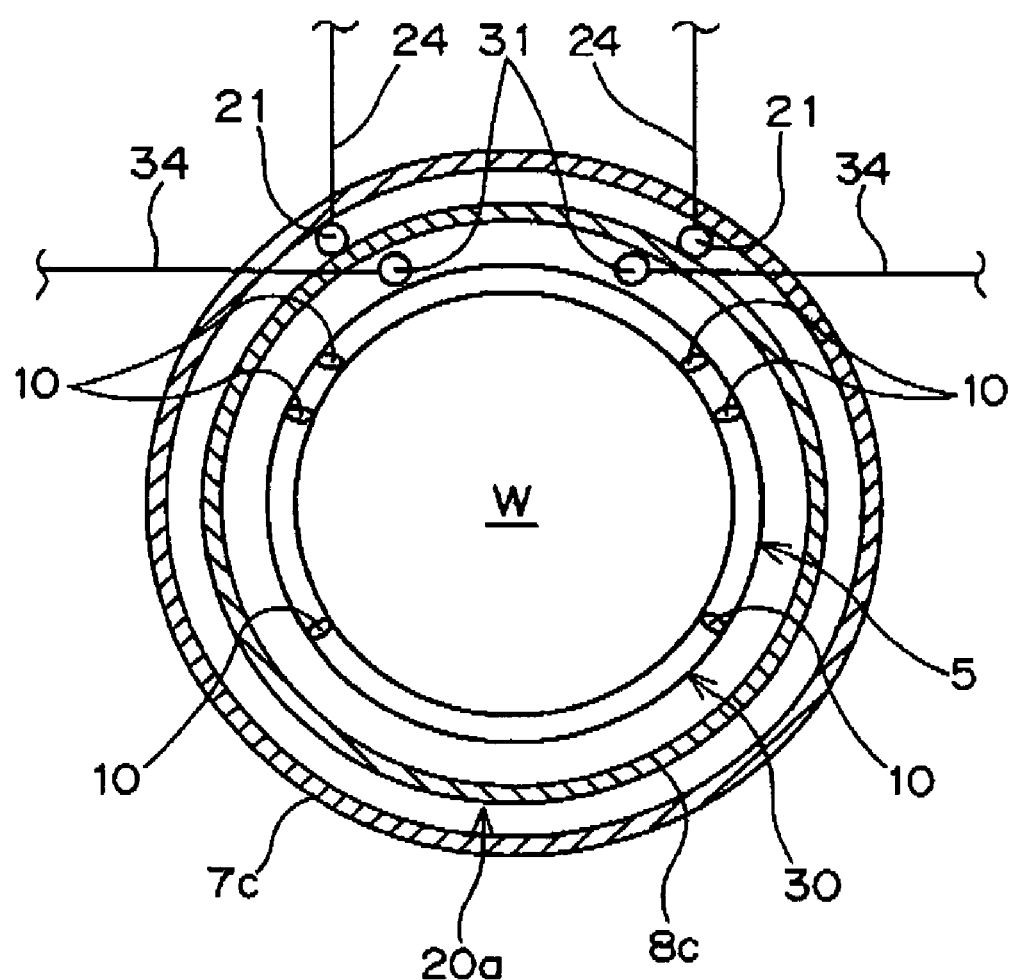
FIG. 3 is a cross-sectional view taken along the line III—III in FIG. 1.

FIGS. 1 and 2 are cross-sectional views of an apparatus 1 of removing polymer in fabrication of a semiconductor device, in accordance with a preferred embodiment of the present invention. In FIG. 1, an internal chamber 8 is introduced into an external chamber 7, and in FIG. 2, the internal chamber 8 is moved out of the external chamber 7. FIG. 3 is a cross-sectional view taken along the line III—III in FIG. 1. FIG. 3 illustrates a positional relation between the external chamber 7 and the internal chamber 8.

The apparatus 1 is comprised of a vertically standing support wall 2, a motor 3 fixed on the support wall 2 and having a horizontally extending rotation shaft 4, a rotor 5 fixed to the rotation shaft 4 of the motor 3, a casing 6 horizontally fixed onto the support wall 2 and surrounding the motor 3 and the rotation shaft 4, an external chamber 7 carried at the casing 6 and surrounding the rotor 5, and an internal chamber 8 in which polymer is removed by means of chemicals when the internal chamber 8 is located inside the external chamber 7, as illustrated in FIG. 1.

The external chamber 7 is designed to be movable relative to the rotor 5 between a first position in which the external chamber 7 defines a first closed space 20 (see FIG. 2) around the rotor 5, and a second position in which the external chamber 7 is kept away from the rotor 5. FIG. 1 illustrates the external chamber 7 in its first position.

Similarly, the internal chamber 8 is designed to be movable relative to the rotor 5 between a first position in which the internal chamber 8 defines a second closed space 30 (see FIG. 1) around the rotor 5, and a second position in which the internal chamber 8 is kept away from the rotor 5. FIG. 1 illustrates the internal chamber 8 in its first position, and FIG. 2 illustrates the internal chamber 8 in its second position. As illustrated in FIG. 1, when the external and internal chambers 7 and 8 are in their first positions, they overlap each other.

The rotation shaft 4 of the motor 3 passes through a vertical wall 7a of the external chamber 7 through a bearing (not illustrated), and projects into the external chamber 7. The rotor 5 is fixed to the rotation shaft 4 at its distal end.

The rotor 5 is comprised of a pair of circular plates 5a and 5b spaced away from each other, and six holders 10 fixed between the circular plates 5a and 5b. Each of the holders 10 is formed with a plurality of grooves (not illustrated) into which a wafer W is inserted at its edge, and hence, the rotor 5 can hold a plurality of wafers W (for instance, 26 wafers) each vertically standing, horizontally arranged. When the motor 3 is in operation, the rotor 5 rotates together with the wafers W.

A knob 11 is formed on the vertical wall 7a for selectively causing the rotor 5 to hold the wafers W and causing the rotor 5 to release the wafers W.

As illustrated in FIGS. 1 and 2, the external chamber 7 includes the vertical wall 7a located closer to the motor 3, a vertical wall 7b located remoter from the motor 3, and a cylindrical wall 7c spaced away from the rotor 5 by a predetermined gap. A seal 15 is formed at the middle of the vertical wall 7a for ensuring hermetically sealing between the rotation shaft 4 and the external chamber 7. When the wafers W is held onto the rotor 5, the external chamber 7 is moved to its second position (to the right in FIGS. 1 and 2) in which the cylindrical wall 7c surrounds the casing 6.

The internal chamber 8 includes a cylindrical wall 8c having a smaller diameter than a diameter of the cylindrical wall 7c of the external chamber 7. As mentioned earlier, the cylindrical wall 8c moves between the first position illustrated in FIG. 1 and the second position illustrated in FIG. 2. In the first position, the cylindrical wall 8c defines the second closed space 30 together with the vertical walls 7a and 7b of the external chamber 7. When the cylindrical wall 8c is located in its second position illustrated in FIG. 2, the external chamber 7 defines the first closed space 20.

The first and second closed spaces 20 and 30 are hermetically sealed by the seal 15. As mentioned later, polymer is removed and the wafers W are rotated both in the second closed space 30, and chemicals are rinsed off and the wafers W are dried in the first closed space 20.

Two discharge nozzles 21 extend at an upper section of the first closed space 20 in a direction in which the cylindrical wall 7c extends. As illustrated in FIGS. 1 and 2, each of the discharge nozzles 21 is designed to have a plurality of discharge openings 22 horizontally arranged. As illustrated in FIG. 2, the discharge nozzles 21 are connected to a pure water source 25 through a first conduit 24. Pure water is fed through the first conduit 24 from the pure water source 25, and sprayed towards the wafers W through the discharge openings 22. Between the discharge nozzles 21 and the pure water source 25 is arranged a selector valve 26.

Two discharge nozzles 31 extend at an upper section of the second closed space 30 in a direction in which the cylindrical wall 8c extends. As illustrated in FIGS. 1 and 2, each of the discharge nozzles 31 is designed to have a plurality of discharge openings 32 horizontally arranged. As illustrated in FIG. 2, the discharge nozzles 31 are connected to a chemicals source 35 through a second conduit 34. Chemicals is fed through the second conduit 34 from the chemicals source 35, and sprayed towards the wafers W through the discharge openings 32. Between the discharge nozzles 31 and the chemicals source 35 is arranged a selector valve 36.

The chemicals discharged through the discharge nozzles 31 dissolve a resist, a polymer layer and/or metal. In this embodiment, ammonium fluoride ($NH_4F$) is used as the chemical.

The vertical wall 7b of the external chamber 7 is formed with a first liquid-exhaust port 41 through which used chemicals is exhausted from the second closed space 30 when the external and internal chambers 7 and 8 are in their first positions. Below the first liquid-exhaust port 41 is arranged a second liquid-exhaust port 42 through which used pure water is exhausted from the first closed space 20 when the external chamber 7 is in its first position and the internal chamber 8 is in its second position, as illustrated in FIG. 2.

Used chemicals is exhausted through the first liquid-exhaust port 41 to a first liquid-exhaust conduit 43, and used pure water is exhausted through second liquid-exhaust port 42 to a second liquid-exhaust conduit 44.

As illustrated in FIG. 1, the vertical wall 7b is formed at an upper section thereof with a first gas-exhaust port 45 through which gas is exhausted out of the second closed space 30 when the external and internal chambers 7 and 8 are in their first positions. Above the first gas-exhaust port 45 is arranged a second gas-exhaust port 46 through which gas is exhausted out of the first closed space 20 when the external chamber 7 is in its first position and the internal chamber 8 is in its second position, as illustrated in FIG. 2. Gas may be exhausted through the second gas-exhaust port 46 out of a space 20a sandwiched between the cylindrical walls 7c and 8c when the external and internal chambers 7 and 8 are in their first positions.

Gas is exhausted through the first gas-exhaust port 45 to a first gas-exhaust conduit 47, and through the second gas-exhaust port 46 to a second gas-exhaust conduit 48.

The vertical wall 7b is formed at the middle thereof with a first port 51 through which inert gas such as nitrogen (N2) is introduced into the second closed space 30 from an inert gas source 54 through an inert gas conduit 53, and a second port 52 through which an oxygen-containing gas such as air is introduced into the second closed space 30 from an oxygen-containing gas source 57 through an oxygen-containing gas conduit 56.

Heaters 53a and 56a are attached to the inert gas conduit 53 and the oxygen-containing gas conduit 56, respectively. The heaters 53a and 56a heat inert gas and oxygen-containing gas to be introduced into the second closed space 30 to thereby raise a temperature in the external chamber 7 for accelerating dissolution of polymer caused by the chemicals.

Mass-flow controllers 55 and 58 control flow rates of the inert gas and the oxygen-containing gas fed through the inert gas conduit 53 and the oxygen-containing gas conduit 56, respectively. Thus, it is possible to control oxidation atmosphere in the second closed space 30.

An inert gas conduit 61 branches off the inert gas conduit 53, and is connected to the selector valve 36. A heater 61a heats inert gas fed through the inert gas conduit 61.

By switching the selector valve 36, the chemicals is sprayed into the second closed space 30 through the discharge nozzles 31 and the second conduit 34 from the chemicals source 35, or heated inert gas is introduced into the second closed space 30 through the inert gas conduit 53, the inert gas conduit 61 and the second conduit 34 from the inert gas source 54.

A mass flow controller 63 controls a flow rate of the inert gas fed through the inert gas conduit 61. Hence, it is possible to control a volume of the inert gas to be introduced into the second closed space 30 through the discharge nozzles 31.

An inert gas conduit 66 branches off the inert gas conduit 61 downstream of the heater 61a and the mass flow controller 63, and is connected to the selector valve 26. Hence, by switching the selector valve 26, pure water is sprayed into the first closed space 20 through the discharge nozzles and the first conduit 24 from the pure water source 25, or heated inert gas is introduced into the first closed space 20 through the inert gas conduit 53, the inert gas conduit 61, the inert gas conduit 66 and the first conduit 24 from the pure water source 25.

The mass flow controller 63 controls a flow rate of the inert gas fed through the inert gas conduit 61. Hence, it is possible to control a volume of the inert gas to be introduced into the first closed space 20 through the discharge nozzles 21.

The mass flow controllers 55, 58 and 63 are controlled in operation by a controller 70. The selector valves 26 and 36 are controlled by the controller 70 as to which conduit is open or shut.

Hereinbelow is explained a method of removing polymer in fabrication of a semiconductor device which method is carried out in the above-mentioned apparatus 1.

Figure 4:
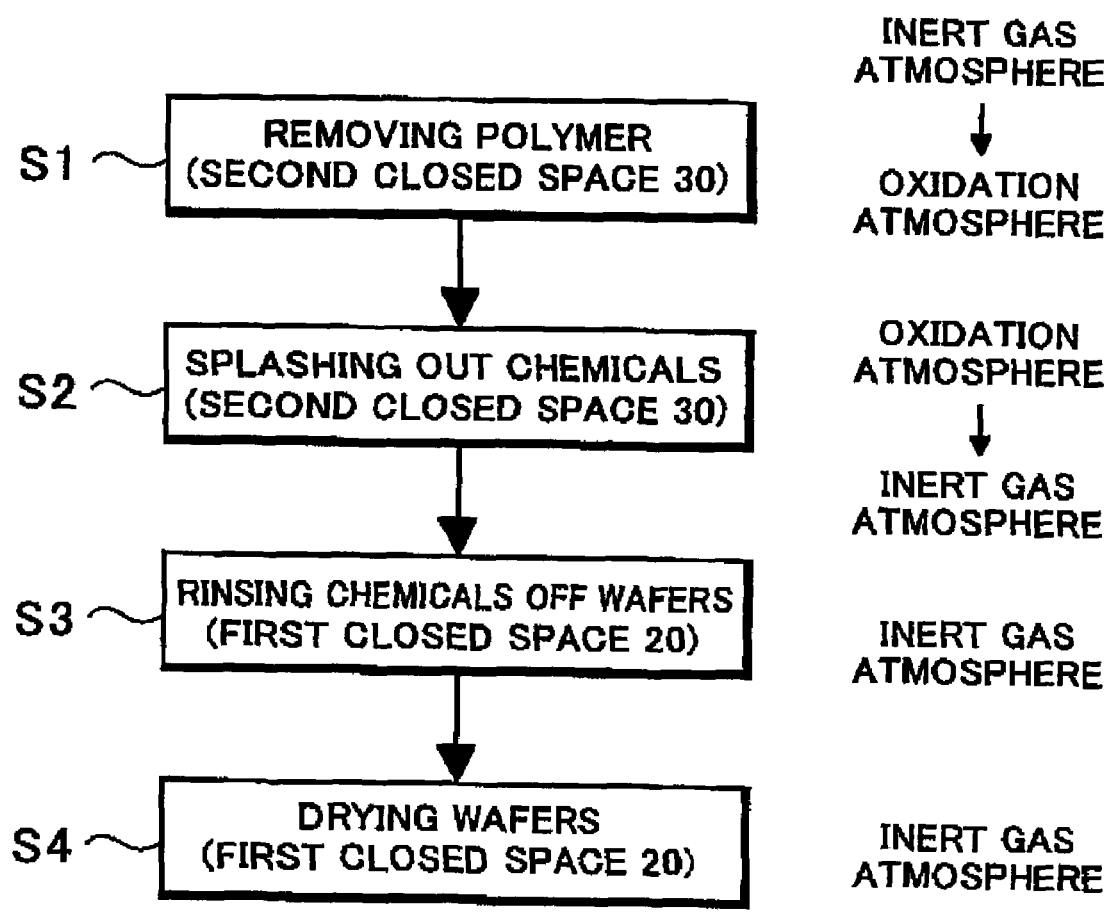
FIG. 4 is a flow-chart of a method of removing polymer, to be carried out in the apparatus illustrated in FIGS. 1 to 3.

FIG. 4 is a flow-chart showing steps to be carried out in the method of removing polymer. As illustrated in FIG. 4, the method includes the steps of dissolving polymer by providing chemicals to the wafers W (step S1), splashing out the chemicals (step S2), rinsing the residual chemicals off by providing pure water onto the wafers W (step S3), and drying the wafers W (step S4).

FIGS. 5A to 5F illustrate steps carried out in the method.

Figure 5A:
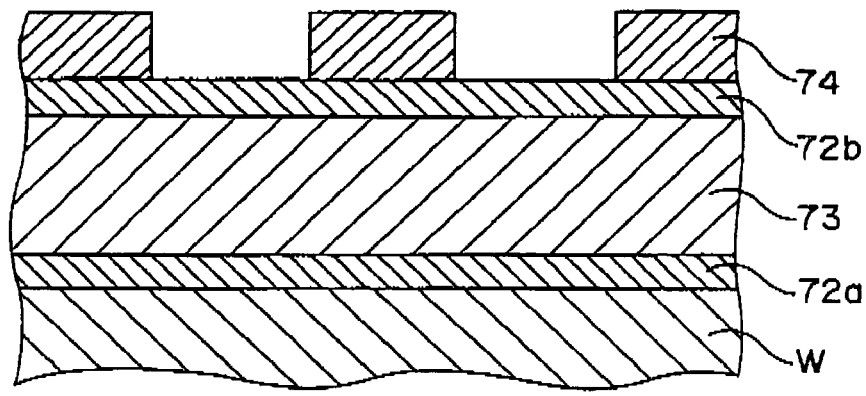
FIGS. 5A to 5F are cross-sectional views of a substrate and layers formed thereon.

First, as illustrated in FIG. 5A, a first barrier layer 72a, an aluminum layer 73, a second barrier layer 72b are formed on a silicon wafer W. Then, a resist layer 74 having a desired wiring pattern is formed on the second barrier layer 72b. The aluminum layer 73 may contain copper (Cu) therein, that is, may be composed of aluminum-copper alloy.

Figure 5B:
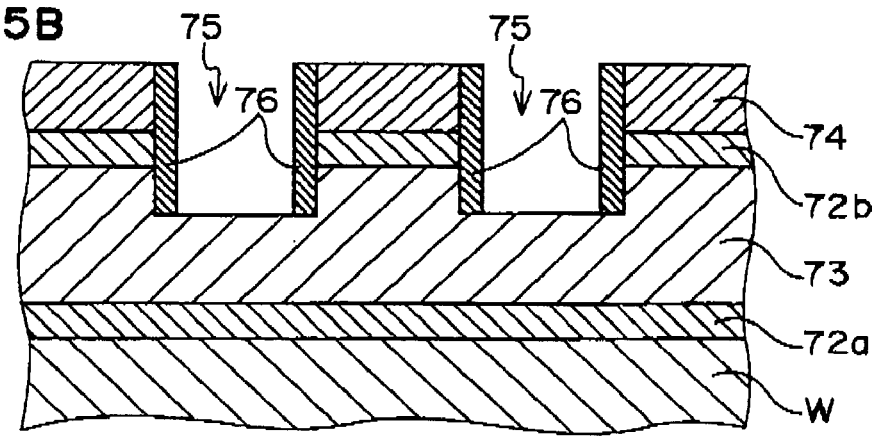

Then, the second barrier layer 72b and the aluminum layer 73 are etched by plasma-etching with the patterned resist layer 74 being used as a mask, as illustrated in FIG. 5B. By carrying out plasma-etching, a polymer layer 76 is formed on a sidewall of an etched portion 75 due to constituents of an etching gas. During plasma-etching, the polymer layer 76 acts as a protection layer, ensuring highly anisotropic etching.

Figure 5C:
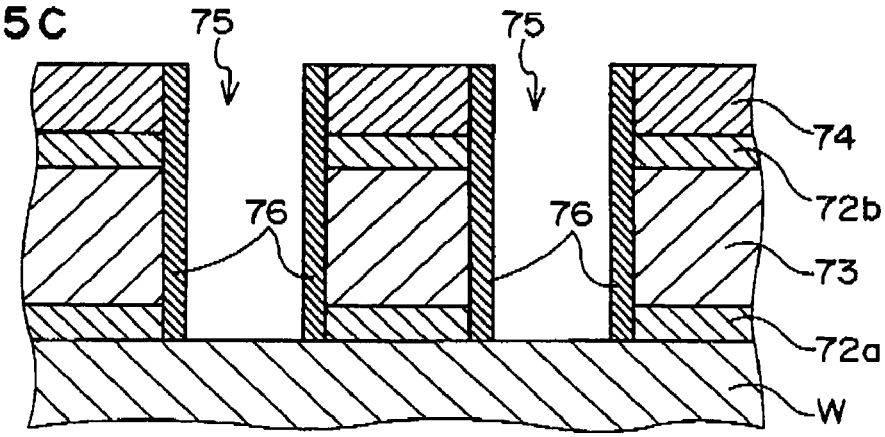

As illustrated in FIG. 5C, the etching is carried out until a surface of the silicon wafer W appears. During the etching, the polymer layer 76 is formed on a sidewall of the etched portion 75.

Figure 5D:
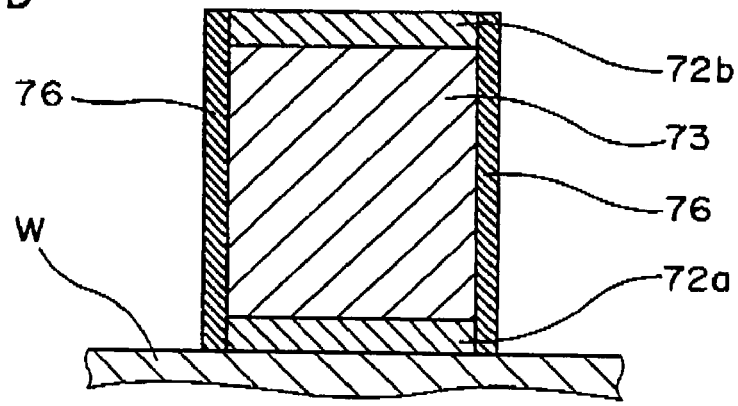

Then, the resist layer 74 is removed by dry ashing. As a result, as illustrated in FIG. 5D, the aluminum layer 73 is covered at an upper surface thereof with the second barrier layer 72, and at a sidewall thereof with the polymer layer 76. Then, the wafer W is introduced into the apparatus 1 for removing the polymer layer 76.

First, the external and internal chambers 7 and 8 are moved into their second positions, in which the rotor 5 is exposed outside. Then, a plurality of the wafers W is fastened to the rotor 5 by means of a feeder (not illustrated) such that the wafers W are held by the holders 10. It is preferable that the wafers W are fastened to the rotor 5, detecting a pressure acting on the wafers W, by means of a pressure sensor (not illustrated). This prevents the wafers W from being damaged.

Then, the external and internal chambers 7 and 8 are moved into their first positions to thereby define the second closed space 30, as illustrated in FIG. 1.

Then, inert gas is introduced into the second closed space 30 from the inert gas source 54 through the inert gas conduit 53 and the first port 51 to thereby render the second closed space 30 into inert gas atmosphere containing no oxygen.

When inert gas is introduced into the second closed space 30, the controller 70 transmits a command to the mass flow controller 55 to thereby allow the inert gas to pass through the inert gas conduit 53 and be discharged through the first port 51. While the inert gas is being introduced into the second closed space 30 through the first port 51, gas existing in the second closed space 30 is exhausted through the first gas-exhaust port 45, resulting in that atmosphere in the second closed space 30 is turned into inert gas atmosphere.

Then, the polymer layer 76 is dissolved for removal by providing the chemicals to the wafers W (step S1 in FIG. 4). The chemicals is sprayed to the wafers W in about 5 to 10 minutes. The chemicals is sprayed to the wafers W through the discharge nozzles 31 for dissolving the polymer layer 76 while the rotor 5 and hence the wafers W are rotated by the motor 3 at 1 to 500 rpm.

For removing the polymer layer 76, the chemicals is sprayed through the discharge nozzles 31 for tens of seconds. While the chemicals is being sprayed, the rotor 5 together with the wafers W is rotated at 1 to 500 rpm to thereby spread the sprayed chemicals over surfaces of the wafers W.

By controlling a rotation speed of the rotor 5 in accordance with a viscosity of the chemicals, it would be possible to uniformly spread the chemicals over surfaces of the wafers W, and hence, possible to uniformly dissolve the polymer layer 76. For instance, if the chemicals has a relatively high viscosity, the rotor 5 is rotated at a relatively high rotation speed in the range of 1 to 500 rpm, whereas if the chemicals has a relatively low viscosity, the rotor 5 is rotated at a relatively low rotation speed in the above-mentioned range. This ensures that the chemicals is uniformly spread over the wafers W.

After dissolution of the polymer layer 76, the chemicals having dissolved the polymer layer 76 resides on surfaces of the wafers W. The chemicals already having dissolved the polymer layer 76 has a low reaction rate. Hence, if the chemicals already having dissolved the polymer layer 76 much resides on the wafers W, spraying the chemicals is temporarily stopped, and the heated inert gas is discharged through the discharge nozzles 31 for a few seconds. In addition, the rotor 5 is rotated at a rotation speed higher than a rotation speed at which the rotor 5 is rotated when the chemicals is sprayed to the wafers W held on the rotor 5. Specifically, the rotor 5 is rotated at about 100 to 1200 rpm. Thus, the chemicals already having dissolved the polymer layer 76 is removed by virtue of a pressure at which inert gas is introduced into the internal chamber 8 and centrifugal force caused by the rotation of the rotor 5.

It is preferable that a rotation speed at which the rotor 5 is rotated is controlled in accordance with a viscosity of the chemicals in order to efficiently remove the chemicals already having reacted with the polymer layer 76. The chemicals splashed out of the wafers W is exhausted through the first liquid-exhaust port 41.

After removing the chemicals already having reacted with the polymer layer 76, out of the surfaces of the wafers W, the rotor 5 is rotated at a reduced rotation speed. Specifically, the rotor 5 is rotated at 1 to 500 rpm, and then, fresh chemicals is introduced into the second closed space 30 through the discharge nozzles 31.

The step of introducing the chemicals into the second closed space 30 and the step of removing the chemicals already having reacted with the polymer layer 76 are repeatedly carried out a few times to thousands of times. This ensures that fresh and hence highly reactive chemicals always make contact with surfaces of the wafers W, and accordingly, the polymer layer 76 can be efficiently removed.

For spraying the chemicals to the wafers W, the controller 70 transmits a command to the selector valve 36 such that the chemicals is fed to the discharge nozzles 31 from the chemicals source 35 through the second conduit 34. The chemicals fed to the discharge nozzles 31 from the chemicals source 35 is sprayed into the internal chamber 8 through the discharge openings 32.

When the heated inert gas is sprayed to the wafers W, the controller 70 transmits a command to the selector valve 36 such that the inert gas conduit 61 and the second conduit 34 are connected to each other. Then, the heated inert gas, which is controlled with respect to a flow rate by the mass flow controller 63, is fed to the discharge nozzles 31 from the inert gas source 54 through the inert gas conduit 53, the inert gas conduit 61 and the second conduit 34, and then, sprayed through the discharge openings 32.

Figure 5E:
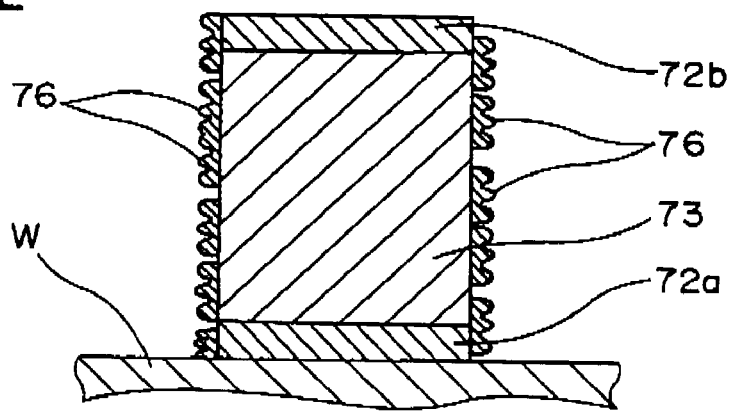

By repeatedly carrying out the step of dissolving the polymer layer 76 and the step of removing the chemicals having reacted with the polymer layer 76, a part of a surface of the aluminum layer 73 is exposed, as illustrated in FIG. 5E. Then, the oxygen-containing gas is introduced into the second closed space 30 from the oxygen-containing gas source 57 through the oxygen-containing gas conduit 56 and the second port 52.

Figure 5F:
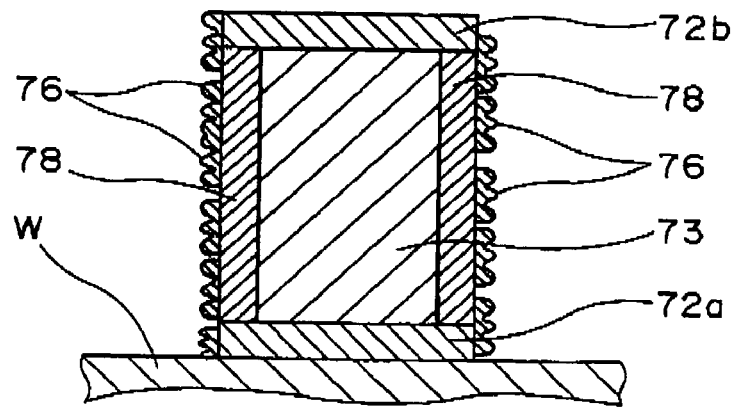

Thus, the second closed space 30 is rendered in oxidation atmosphere having a predetermined concentration of oxygen. When the chemicals having reacted with the polymer layer 76 is removed out of the wafers W, oxygen in the oxygen atmosphere makes contact with an exposed surface of the aluminum layer 73. As a result, the aluminum layer 73 is oxidized at a surface thereof into aluminum oxide ($Al_2O_3$). Thus, as illustrated in FIG. 5F, an oxide skin 78 is formed at a surface of the aluminum layer 73.

By repeatedly removing the chemicals having reacted with the polymer layer 76, fresh oxygen repeatedly makes contact with a surface of the aluminum layer 73. Hence, before termination of the dissolution of the polymer layer 76 by the chemicals, the oxide skin 78 having a sufficient thickness is formed at a surface of the aluminum layer 73.

For introducing the oxygen-containing gas into the second closed space 30, the controller 70 transmits a command to the mass flow controller 58 such that the oxygen-containing gas is fed through the oxygen-containing gas conduit 56 and is introduced into the internal chamber 8 through the second port 52. For rendering the second closed space 30 in oxidation atmosphere having a predetermined concentration of oxygen, the controller 70 transmits a command to the mass flow controller 58 such that a flow rate of the oxygen-containing gas is controlled for raising an oxygen concentration of the second closed space 30. If an oxygen concentration in the second closed space 30 is increased beyond a predetermined concentration, the controller 70 transmits a command to the mass flow controller 55 such that a flow rate of the inert gas is controlled for reducing an oxygen concentration in the second closed space 30.

As mentioned above, it is possible to adjust an oxygen concentration in the second closed space 30 to a desired concentration by controlling the mass flow controllers 55 and 58. It is preferable that the second closed space 30 has an oxygen concentration of 10% or greater.

It is also possible to control a pressure in the second closed space 30 such that the pressure is not over a predetermined pressure, by selectively discharging the gas out of the second closed space 30 through the first gas-exhaust port 45 and introducing the oxygen-containing gas and/or the inert gas into the second closed space 30.

After the step (S1 in FIG. 4) of dissolving the polymer layer 76 has been carried out, the step (S2 in FIG. 4) of removing the chemicals out of the wafers W starts. The step of removing the chemicals takes about 30 seconds.

First, the chemicals is stopped from being sprayed into the internal chamber 8 through the discharge nozzles 31. Then, the rotor 5 and hence the wafers W are rotated to thereby splash the chemicals and reaction residues out of the wafers W. The chemicals splashed out of the wafers W is discharged through the first liquid-exhaust port 41. The inert gas, the oxygen-containing gas and the chemicals atmosphere are discharged through the first gas-exhaust port 45.

While the rotor 5 is being rotated for splashing the chemicals out of the wafers W, the inert gas is introduced into the second closed space 30 through the first port 51 for rendering the second closed space 30 in inert gas atmosphere containing no oxygen. The inert gas is introduced into the space 20a sandwiched between the cylindrical walls 7c and 8c, through the discharge nozzle 21 to thereby render the space 20a in inert gas atmosphere containing no oxygen.

For introducing the inert gas into the space 20a, the controller 70 transmits a command to the selector valve 26 such that the inert gas conduit 66 and the first conduit 24 are in fluid communication with each other. The inert gas, which is controlled by the mass flow controller 63 with respect to a flow rate, is fed from the inert gas source 54 to the discharge nozzles 21 through the inert gas conduit 53, the inert gas conduit 61, the inert gas conduit 66 and the first conduit 24. Then, the heated inert gas is introduced into the space 20a through the discharge openings 22. While the inert gas is introduced into the space 20a through the discharge nozzles 21, gas existing in the space 20a is exhausted through the second gas-exhaust port 46. That is, the oxidation atmosphere is exhausted out of the space 20a, and instead, the space 20a is rendered in inert gas atmosphere.

As mentioned above, inert gas is introduced into both the second closed space 30 and the space 20a while the rotor 5 together with the wafers W is rotated to splash the chemicals out of the wafers W. Hence, until the step of splashing the chemicals out of the wafers W ends, the second closed space 30 and the space 20a are rendered in inert gas atmosphere. The second closed space 30 and the space 20a cooperate with each other to define the first closed space 20 in the external chamber 7. Since the second closed space 30 and the space 20a have been rendered in inert gas atmosphere, the first closed space 20 in which the wafers W are located is also in inert gas atmosphere.

Then, pure water is sprayed to the wafers W through the discharge nozzles 21 to thereby rinse the chemicals off the wafers W (step S3 in FIG. 4). The pure water is kept sprayed for about 3 to 10 minutes. The step of rinsing the chemicals off the wafers W is carried out in the first closed space 20 in the inert gas atmosphere. While the rotor 5 together with the wafers W is rotated, the pure water is discharged into the first closed space 20 through the discharge nozzles 21 for washing the wafers W. The used pure water is discharge through the second liquid-exhaust port 42.

For introducing the pure water into the first closed space 20, the controller 70 transmits a command to the selector valve 26 such that the pure water is fed to the discharge nozzles 31 from the pure water source 25 through the first conduit 24. Then, the pure water is sprayed to the wafers W through the discharge openings 22.

As mentioned above, the oxide skin 78 has been formed on a sidewall of the etched aluminum layer 73. In addition, the second barrier layer 72b is formed on the aluminum layer 73. Hence, the aluminum layer 73 is entirely covered with the oxide skin 78 and the second barrier layer 72b, as illustrated in FIG. 5F, and accordingly, aluminum of which the aluminum layer 73 is composed is not exposed at all. Hence, even if pure water is sprayed to surfaces of the wafers W, the pure water does not make contact with the aluminum. This ensures that aluminum is not dissolved into the pure water.

In the step S2 of splashing the residual chemicals out of the wafers W, even if the chemicals is not splashed out and reacts with pure water to thereby generate a solution into which aluminum is likely to be dissolved, aluminum in the aluminum layer 73 does not make contact with the solution. Hence, aluminum is not dissolved into the solution. Similarly, even if the aluminum layer 73 contains copper therein, the oxide skin 78 prevents aluminum from being dissolved into the pure water. Thus, it is possible to prevent the aluminum layer 73 from becoming thin.

If aluminum is dissolved into the pure water or the above-mentioned solution, there are generated contaminants such as metal impurity, and the thus generated contaminants are adhered to the wafers W with the result of reduction in a fabrication yield of a semiconductor device. Since the oxide skin 78 prevents aluminum from being dissolved into the pure water or the solution, it is possible to prevent reduction in a fabrication yield of a semiconductor device.

After the chemicals is rinsed off the wafers W, the wafers W are dried by rotating the rotor 5 and hence the wafers W at a relatively high rotation speed (step S4 in FIG. 4). The step of rotating the rotor 5 is carried out in the first closed space 20 in the inert gas atmosphere. Inert gas may be introduced into the first closed space 20 through the discharge nozzles 21 for drying the wafers W.

After the wafers W have been dried, the external chamber 7 is moved to its second position (the internal chamber 8 has been already moved to its second position). Hence, both of the external and internal chambers 7 and 8 are in the second position in which the cylindrical walls 7c and 8c are located surrounding the casing 6.

Then, a feeder (not illustrated) is caused to move to the rotor 5 and be located below the rotor 5. The holders 10 release the wafers W, which are then transferred to the feeder. The feeder carries the wafers W out of the external chamber 7.

In accordance with the above-mentioned method of removing polymer, since oxygen in oxidation atmosphere reacts with a surface of the etched aluminum layer 73, there is formed the oxide skin 78 at the surface. Thus, even if the wafers W are washed with pure water, the oxide skin 78 prevents aluminum from being dissolved into the pure water.

In addition, the aluminum layer 73 could have an enhanced resistance to a solution composed of mixture of pure water and the chemicals. Furthermore, it is possible to prevent generation of contaminants such as metal impurity in the step of rinsing the chemicals off the wafers W. Thus, it is possible to prevent the aluminum layer 73 from becoming thin and contaminants from adhering to the wafers W, ensuring enhancement in a fabrication yield of a semiconductor device.

While the present invention has been described in connection with certain preferred embodiment, it is to be understood that the subject matter encompassed by way of the present invention is not to be limited to the specific embodiment. On the contrary, it is intended for the subject matter of the invention to include all alternatives, modifications and equivalents as can be included within the spirit and scope of the following claims.

For instance, there may be used, in place of the semiconductor wafer, a glass substrate to be used as a substrate in a liquid crystal display device, a CD substrate, a printed substrate or a ceramics substrate.

In the above-mentioned embodiment, the resist mask is removed by dry ashing, and then, the polymer layer 76 is removed by the chemicals. Dry ashing may be omitted, in which case, the resist mask together with the polymer layer 76 may be removed by the chemicals.

The present invention may be applied to not only an apparatus having such a structure as the structure of the above-mentioned apparatus 1, but also a batch-type apparatus, for instance.

The step of splashing out the chemicals by rotating the rotor 5 together with the wafers W may be carried out in the first closed space 20 in oxidation atmosphere. For instance, the step of removing the polymer layer 76 by chemicals is carried out with the second closed space 30 and the space 20a being kept in oxidation atmosphere, and then, the step of splashing out the chemicals by rotating the rotor 5 together with the wafers W is carried out as the second closed space 30 and the space 20a are turned into inert gas atmosphere from the oxidation atmosphere. Then, the internal chamber 8 is moved to its second position to thereby put the wafers W in the first closed space 20 which is in the inert gas atmosphere. Then, the step of rinsing the chemicals off the wafers W is carried out.

When the inert gas is introduced into the second closed space 30, the controller 70 transmits a command to the mass flow controller 55 to thereby allow the inert gas to pass through the inert gas conduit 53 and be discharged through the first port 51. While the inert gas is being introduced into the second closed space 30 through the first port 51, gas existing in the second closed space 30 is exhausted through the first gas-exhaust port 45, resulting in that atmosphere in the second closed space 30 is turned into inert gas atmosphere.

The inert gas may be introduced into the second closed space 30 through the discharge nozzles 21, in which case, a flow rate of the inert gas to be introduced into the first closed space 20 can be controlled by the mass flow controller 63.

Though the second closed space 30 is turned into the inert gas atmosphere from the oxidation atmosphere while the chemicals is being splashed out by rotating the wafers W, substitution to the inert gas atmosphere from the oxidation atmosphere may be started before the step of removing the polymer layer 76 by chemicals ends. For instance, after the oxide skin 78 having a sufficient thickness has been formed around the etched aluminum layer 73, the oxidation atmosphere is gradually exhausted out of the second closed space 30 to thereby reduce an oxygen concentration in the second closed space 30, and simultaneously, the inert gas is introduced into the second closed space 30 such that the second closed space 30 is turned completely into the inert gas atmosphere when the step of removing the polymer layer 76 by the chemicals. Then, the step of splashing out the chemicals by rotating the rotor 5 together with the wafers W is carried out in the second closed space 30 which is in the inert gas atmosphere.

The space 20a may be turned into the inert gas atmosphere before the internal chamber 8 is moved to its second position. Hence, the space 20a may be turned into the inert gas atmosphere while the step of removing the polymer layer 76 by the chemicals is being carried out. For instance, the substitution to the inert gas atmosphere from the oxidation atmosphere in the space 20a may start immediately after the wafers W are fastened to the rotor 5 and then the internal chamber 8 is moved to its first position.

If the substitution to the inert gas atmosphere from the oxidation atmosphere in the second closed space 30 and the space 20a ends when the step of removing the polymer layer 76 by the chemicals has ended, the internal chamber 8 is moved to its second position, and the step of splashing the chemicals out of the wafers W by rotating the rotor 5 may be carried out in the first closed space 20 which is in the inert gas atmosphere.

In the above-mentioned embodiment, the oxidation atmosphere is established after the step of removing the polymer layer 76 by the chemicals has started. In contrast, the step of splashing the chemicals out of the wafers W by rotating the rotor 5 may be carried out full-time in the oxidation atmosphere without establishing the inert gas atmosphere at the start of the step of removing the polymer layer 76 by the chemicals, in which case, the oxide skin 78 can be well formed, and in addition, the step of removing the polymer layer 76 by the chemicals can be simplified. Furthermore, it is no longer necessary to waste time for establishing the inert gas atmosphere before spraying the chemicals to the wafers W, it would be possible to shorten time for carrying out the method, ensuring enhancement in a throughput.

The steps of removing the polymer layer 76 by the chemicals (step S1 in FIG. 4), splashing the chemicals out of the wafers W by rotating the rotor 5 together with the wafers W (step S2 in FIG. 4), rinsing the chemicals off the wafers W (step S3 in FIG. 4), and drying the wafers W (step S4 in FIG. 4) may be carried out all in the oxidation atmosphere, in which case, the method can be simplified.

The oxide skin 78 may be formed before spraying pure water to the wafers W. For instance, the oxide skin 78 may be formed in the oxidation atmosphere without rotating the wafers W before spraying pure water to the wafers W after carrying out the step of splashing the chemicals out of the wafers W by rotating the rotor 5 together with the wafers W.

The oxide skin 78 may be formed by carrying out the step of removing the polymer layer 76 in the inert gas atmosphere and carrying out the step of splashing the chemicals out of the wafers W in the oxidation atmosphere. However, the step of removing the polymer layer 76 by the chemicals takes 5 to 10 minutes, the step of splashing the chemicals out of the wafers W takes 30 seconds, and the step of rinsing the chemicals off the wafers W takes 3 to 10 minutes. Hence, even if oxidizing gas is introduced into the second closed space 30 while the step of splashing the chemicals out of the wafers W is being carried out, it would not be possible to well form the oxide skin 78 in about 30 seconds. This means that it is not possible to prevent aluminum from being corroded in the subsequent step of rinsing the chemicals off the wafers W.

The step of splashing the chemicals out of the wafers W may be prolonged in order to well form the oxide skin 78. However, since a time for carrying out the method is also prolonged, a throughput is lowered. In addition, if the step of splashing the chemicals out of the wafers W is prolonged, the wafers W are excessively dried in the step of splashing the chemicals out of the wafers W. As a result, particles are likely to be adhered to the wafers W, and such particles having adhered to the wafers W cannot be well removed even in the next rinsing step. This results in reduction in a fabrication yield.

Furthermore, if the motor 3 is in operation for a long time for carrying out the step of splashing the chemicals out of the wafers W, much dusts are generated in the motor 3 and/or the rotation shaft 4, resulting in that atmosphere in the apparatus 1 may be contaminated. In contrast, in the present invention, the step of removing the polymer layer 76 by the chemicals is longer in time than the step of splashing the chemicals out of the wafers W, and the oxide skin 78 having a sufficient thickness can be formed without prolongation of the step of removing the polymer layer 76 by the chemicals and the step of splashing the chemicals out of the wafers W, by introducing the oxygen-containing gas into the second closed space 30 while the step of removing the polymer layer 76 by the chemicals is being carried out. Accordingly, it is possible to prevent particles from sticking to the wafers W due to excessive drying, and prevent generation of dusts in the motor 3 and/or the rotation shaft 4 without reduction in a throughput.

In addition, since the fresh chemicals is repeatedly supplied into the second closed space 30 while the step of removing the polymer layer 76 by the chemicals is being carried out, it is possible to prevent particles from sticking to the wafers W. Hence, it is preferable to form the oxide skin 78 in the step of removing the polymer layer 76.

The step of splashing the chemicals out of the wafers W by rotating the rotor 5 may be omitted, in which case, the chemicals is rinsed off the wafers W with pure water. Even if the chemicals reacts with pure water at a surface of the wafers W, and resultingly, there is generated a solution into which aluminum is likely to be dissolved, aluminum of which the aluminum layer 73 is composed does not make contact with such a solution, and hence, is not dissolved into the solution.

The entire disclosure of Japanese Patent Application No. 2002- filed on, 2002 including specification, claims, drawings and summary is incorporated herein by reference in its entirety.

What is claimed is:

1. A method of removing polymer adhered to a sidewall of an etched metal layer formed on a substrate, comprising:
   (a) dissolving said polymer by providing chemicals onto a surface of said substrate; and
   (b) rinsing said chemicals out of said substrate by providing pure water onto a surface of said substrate, wherein at least a part of said step (a) is carried out in an oxidation atmosphere that is created by supplying pure oxygen to said substrate.

2. The method as set forth in claim 1, wherein said steps (a) and (b) are carried out in oxidation atmosphere.

3. The method as set forth in claim 1, wherein said step (a) is carried out in oxidation atmosphere from the beginning or middle thereof till said step (b) starts.

4. The method as set forth in claim 1, wherein said oxidation atmosphere is established after said polymer is dissolved by said chemicals until said sidewall appears.

5. The method as set forth in claim 1, further comprising the step of (c) rotating said substrate to splash said chemicals out of said substrate by virtue of centrifugal force, said step (c) being carried out between said steps (a) and (b).

6. The method as set forth in claim 5, wherein said step (c) is carried out in oxidation atmosphere.

7. The method as set forth in claim 5, wherein at least a part of said step (a) is carried out in oxidation atmosphere when a period of time in which said step (a) is carried out is longer than a period of time in which said step (b) is carried out.

8. The method as set forth in claim 1, further comprising the step (d) of drying said substrate, said step (d) being carried out after said step (b).

9. The method as set forth in claim 1, wherein said step (a) is carried out in inert atmosphere except while said step (a) is carried out in oxidation atmosphere.

10. The method as set forth in claim 1, wherein said steps (a) and (b) are repeatedly carried out.

11. The method as set forth in claim 1, wherein said metal layer is an aluminum layer.

12. The method as set forth in claim 11, wherein said aluminum layer contains copper.

13. The method as set forth in claim 1, wherein a barrier layer is formed on said metal layer.

14. The method as set forth in claim 1, wherein said chemicals is ammonium fluoride.

15. A method of removing polymer adhered to a sidewall of an etched metal layer formed on a substrate, comprising:
placing the substrate in a closed space;
then dissolving said polymer by providing chemicals onto a surface of said substrate; and
then rinsing said chemicals out of said substrate by providing pure water onto a surface of said substrate,
wherein at least a part of said dissolving said polymer step is carried out while supplying oxygen to the closed space.

16. The method as set forth in claim 15, wherein said steps of dissolving said polymer and rinsing said chemicals are carried out while supplying oxygen to the closed space.

17. The method as set forth in claim 15, further comprising the step of rotating said substrate to splash said chemicals out of said substrate by virtue of centrifugal force, said step of rotating said substrate being carried out between said steps of dissolving said polymer and rinsing said chemicals.

18. The method as set forth in claim 17, wherein said step of rotating said substrate is carried out while supplying oxygen to said closed space.

19. The method as set forth in claim 15, further comprising the step of drying said substrate, said step of drying said substrate being carried out after said step of rinsing said chemicals.

20. The method as set forth in claim 15, wherein said step of dissolving said polymer is carried out in an inert atmosphere except when oxygen is being supplied during said step of dissolving said polymer.

21. The method as set forth in claim 15, wherein said steps of dissolving said polymer and rinsing said chemicals are repeatedly carried out.

22. The method as set forth in claim 15, wherein said metal layer is an aluminum layer.

23. The method as set forth in claim 22, wherein said aluminum layer contains copper.

24. The method as set forth in claim 15, wherein a barrier layer is formed on said metal layer.

25. The method as set forth in claim 15, wherein said chemicals is ammonium fluoride.

26. A method of removing polymer adhered to a sidewall of an etched metal layer formed on a substrate, comprising:
placing the substrate in a closed space;
then supplying an inert gas to said closed space;
then dissolving said polymer by providing chemicals onto a surface of said substrate; and
then rinsing said chemicals out of said substrate by providing pure water onto a surface of said substrate,
wherein at least a part of said dissolving said polymer step is carried out while supplying pure oxygen to the closed space.

27. The method as set forth in claim 26, wherein an oxygen concentration in said closed space is 10% or greater.

* * * * *